(12) United States Patent
Lukes et al.

(10) Patent No.: US 6,218,901 B1
(45) Date of Patent: Apr. 17, 2001

(54) HIGH SPEED DIFFERENTIAL OUTPUT DRIVER WITH INCREASED VOLTAGE SWING AND PREDRIVE COMMON MODE ADJUSTMENT

(75) Inventors: Eric John Lukes; James David Strom, both of Rochester; Dana Marie Woeste, Mantorville, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/415,675

(22) Filed: Oct. 12, 1999

(51) Int. Cl.[7] ........................................ H03F 3/45
(52) U.S. Cl. .............................. 330/258; 330/259
(58) Field of Search .......................... 330/252, 255, 330/258, 259, 295, 300, 311

(56) References Cited

U.S. PATENT DOCUMENTS 4,904,953 * 2/1990 McCormack ..................... 330/258
5,254,956 * 10/1993 Nishijima ......................... 330/258
5,798,664 * 8/1998 Nagahori et al. .................. 327/307
5,898,341 * 4/1999 Miyashita ......................... 330/253

* cited by examiner

Primary Examiner—Benny Lee
Assistant Examiner—Henry Choe
(74) Attorney, Agent, or Firm—Joan Pennington

(57) ABSTRACT

A high speed differential output driver is provided with increased voltage swing and predrive common mode adjustment. The high speed differential output driver includes a differential input with a voltage amplifier receiving the differential input signal and a common mode adjustment signal and providing an adjustable voltage amplified signal. An emitter follower is coupled to the voltage amplifier. The emitter follower provides a level shifted voltage amplified signal. A driver is coupled to the emitter follower receiving the level shifted voltage amplified signal and providing a driver output signal.

12 Claims, 6 Drawing Sheets

HIGH SPEED DIFFERENTIAL OUTPUT DRIVER WITH INCREASED VOLTAGE SWING AND PREDRIVE COMMON MODE ADJUSTMENT

FIELD OF THE INVENTION

The present invention relates to a high speed differential output driver with increased voltage swing and predrive common mode adjustment.

DESCRIPTION OF THE RELATED ART

In systems with power supply voltages for microprocessors shrinking faster than for supporting circuitry, there is a need for output drivers that can send, signals to receivers on both the lower supply chips and the higher supply chips. With the receiver switching thresholds on these two extremes being at significantly different voltages, a signal must have an amplitude that crosses through both thresholds with relatively little delay in between.

A need exists for a driver having a lower common mode level and a large signal swing, while maintaining fast rise/fall times which minimizes system skew.

SUMMARY OF THE INVENTION

A principal object of the present invention is to provide a high speed differential output driver with increased voltage swing and predrive common mode adjustment.

In brief, a high speed differential output driver is provided with increased voltage swing and predrive common mode adjustment. The high speed differential output driver includes a differential input with a voltage amplifier receiving the differential input signal and a common mode adjustment signal and providing an adjustable voltage amplified signal. An emitter follower is coupled to the voltage amplifier. The emitter follower provides a level shifted voltage amplified signal. A driver is coupled to the emitter follower receiving the level shifted voltage amplified signal and providing a driver output signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
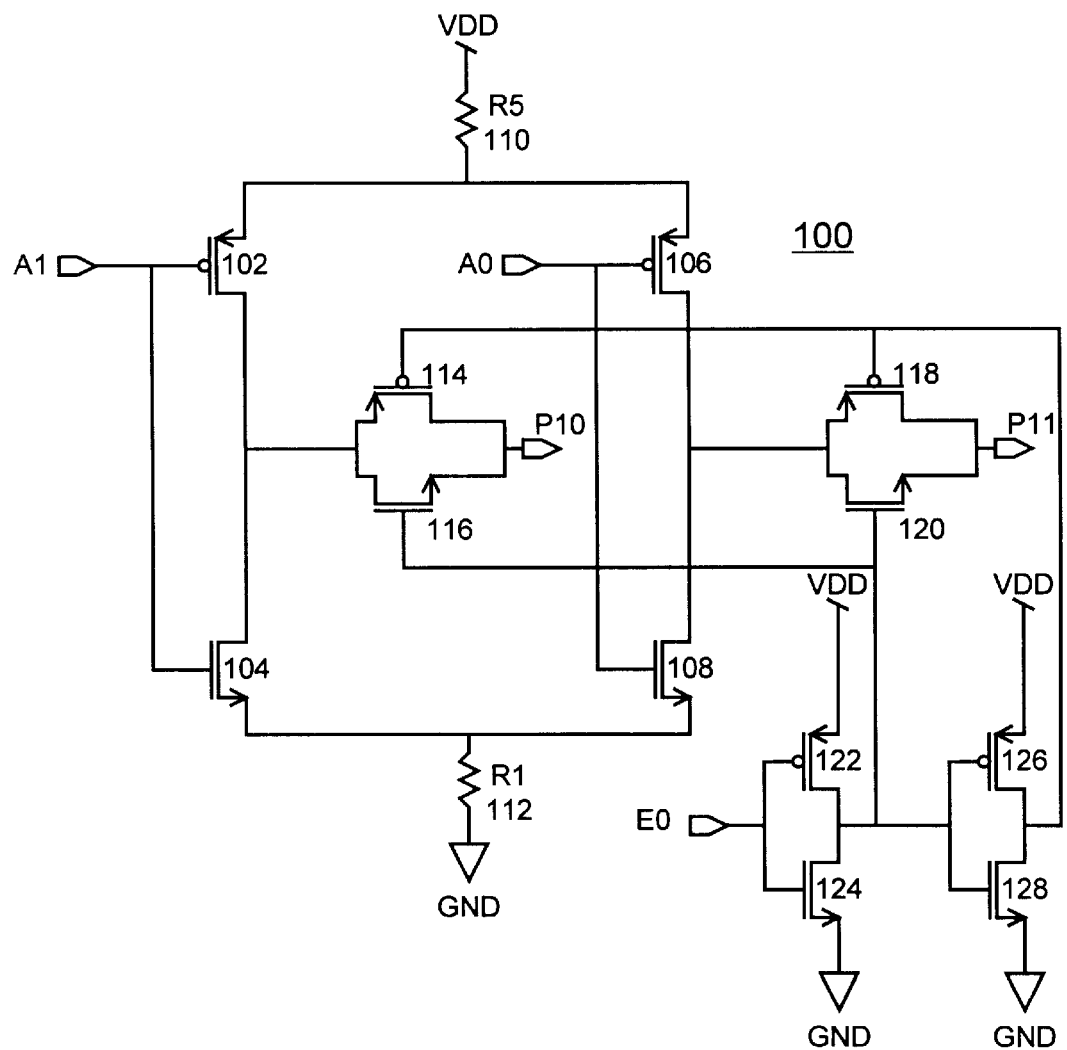
FIG. 1 is a schematic diagram of a push-pull output driver stage of the preferred embodiment.

Referring now to FIG. 1, there is shown a push-pull output driver stage generally designated by the reference character 100 of the preferred embodiment. The invention uses the push-pull type driver 100, with a replicated driver common mode feedback loop to provide a large signal swing with fast rise/fall times and a lower common mode. The push-pull driver output stage 100 includes a series connected P-channel field effect transistor (PFET) 102 and a N-channel field effect transistor (NFET) 104 receiving a gate input A1. A series connected PFET 106 and NFET 108 receive a gate input A0. A differential signal comes into A0/A1. PFET 102 and NFET 104 and PFET 106 and NFET 108 act as inverters, but with the drains of PMOS devices PFETs 102 and 106 connected to a resistor R5, 110 instead of the voltage supply VDD, the high level of the output is reduced. A similar effect occurs with the NMOS devices NFETs 104, 108. With the sources of NMOS devices NFETs 104, 108 connected to a resistor R1, 112 instead of ground GND, the low level of the output is raised.

A differential output signal are provided at outputs P10 and P11. A source of PFET 114 and a source of an NFET 116 are connected to the output P10. The drain of PFET 114 and the drain of NFET 116 are connected between the series connected PFET 102 and NFET 104. A source of a PFET 118 and a source of an NFET 120 are connected to the output P10. The drain of PFET 118 and the drain of NFET 120 are connected between the series connected PFET 106 and NFET 108. A first PFET 122 and a first NFET 124 are connected in series between a supply voltage VDD and ground. An enable input E0 is applied to the gate of both the PFET 122 and NFET 124. A gate of both of a second series connected PFET 126 and NFET 128 is connected to the common connection of the source of PFET 122 and the drain of NFET 124. The common connection of the source of PFET 122 and the drain of NFET 124 provides an enable high input to NFETS 116 and 120. The common connection of the source of PFET 126 and the drain of NFET 128 provides an enable low input to PFETs 114 and 118.

By varying the sizes of the PMOS and NMOS devices PFETs 102, 106 and NFETs 104, 108 as well as the sizes of R5 and R1, the output high level, output low level, and output edge rates can be adjusted. For a given input signal a unique combination of these sizes will proved the best output signal characteristics, but will not necessarily give the desired output common mode level. Another drawback is that this driver 100 has relatively little gain. Therefore a gain stage and a common mode feedback loop are used.

Figure 2:
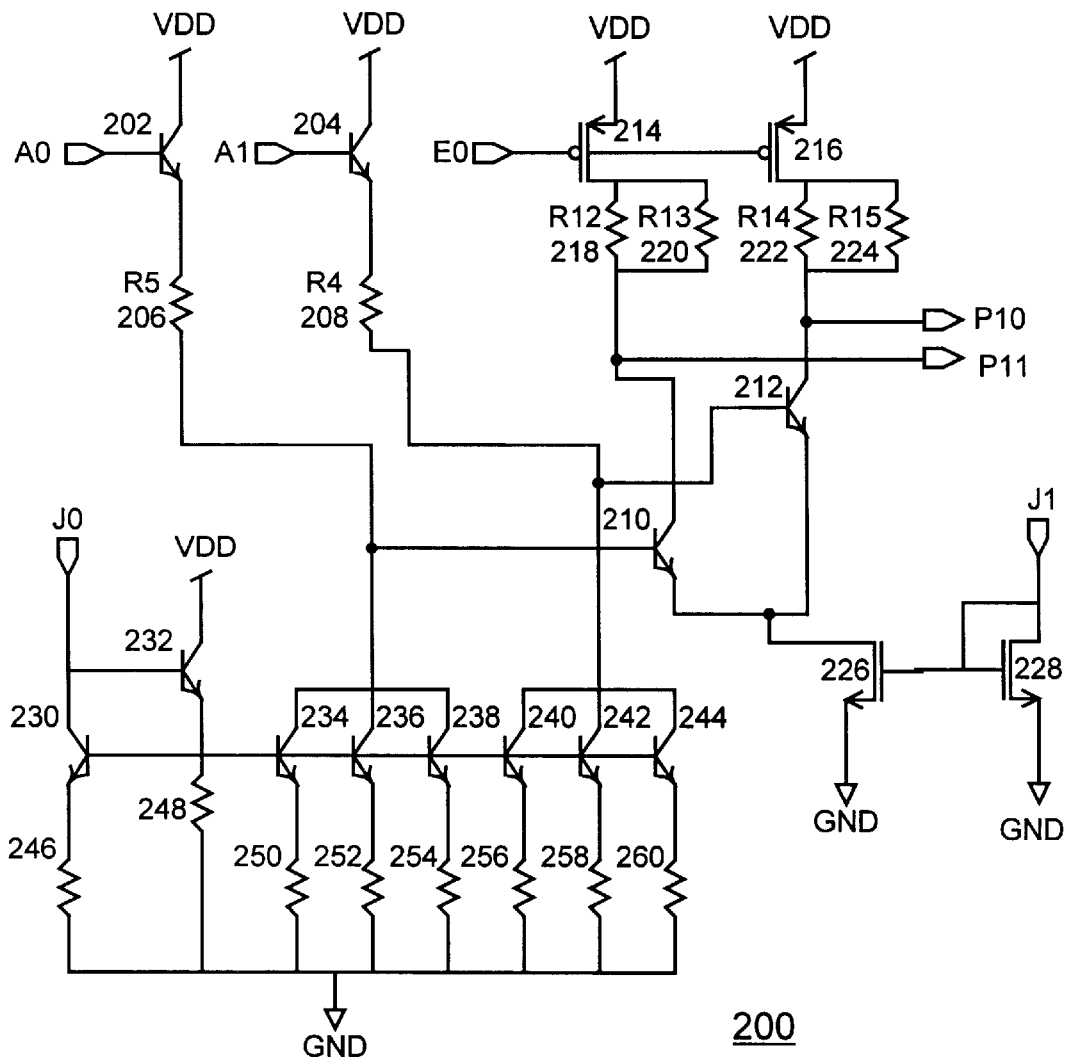
FIG. 2 is a schematic diagram of a voltage amplifier gain stage of the preferred embodiment.

Referring to FIG. 2, there is shown a voltage amplifier gain stage generally designated by the reference character 200 of the preferred embodiment. Voltage amplifier stage 200 provides an adjustable amount of gain to give the large signal swings. A VDD referenced small amplitude differential signal comes into inputs A0 and A1. A pair of bipolar NPN transistors 202 and 204, each having a collector connected to a supply voltage VDD and an emitter connected to a respective resistor R5, R4, 206 and 208 receive the differential signal at a base input A0 and A1. NPN transistors 202 and 204 and R5, R4 206 and 208 shift the signal level down to the bases of a second pair of bipolar NPN transistors 210 and 212. A pair of P-channel field effect transistors PFETs 214 and 216 have a source connected to the supply voltage VDD and a gate connected to an enable input E0. A source of the PFETs 214 and 216 is respectively connected via a respective parallel pair of resistors R12, R13, 218 and 220 and R14, R15, 222 and 224 to a collector of NPN transistors 210 and 212. An N-channel field effect transistor NFET 226 is connected between the emitter of the NPN transistors 210 and 212 and ground. A gate of NFET 226 is connected to the gate and drain of an NFET 228 and an adjustment current J1 input. The NFET 228 is connected between the adjustment current J1 input and ground. A reference current J0 input is connected to a collector of an NPN transistor 230 and to a base of an NPN transistor 232. The collector of NPN transistor 232 is connected to the voltage supply VDD. A base of the NPN transistor 230 is connected to a base of each of a plurality of NPN transistors 234, 236, 238, 240, 242, and 244. A respective resistor 246, 248, 250, 252, 254, 256, 258 and 260 is connected to an emitter of the NPN transistors 230, 232, 234, 236, 238, 240, 242, and 244. The collectors of NPN transistors 234, 236, 238 are connected to the base of NPN transistor 210. The collectors of NPN transistors 240, 242, and 244 are connected to the base of NPN transistor 212.

The NPN transistors 210 and 212 and resistors R12, R13, 218 and 220 and R14, R15, 222 and 224 function as a differential amplifier driving a large amplitude VDD referenced signal output of P10/P11. The amplitude of the signal is set by the size of the resistors R12, R13, 218 and 220 and R14, R15, 222 and 224 and the current through the differential pair NPN transistors 210 and 212. The current is varied by the common mode feedback loop via the adjustment current J1 input to NFETs 226 and 228 to change the amplitude and common mode of the output signal. The signal out of P10/P11 passes through an emitter follower stage illustrated in FIG. 3.

Figure 3:
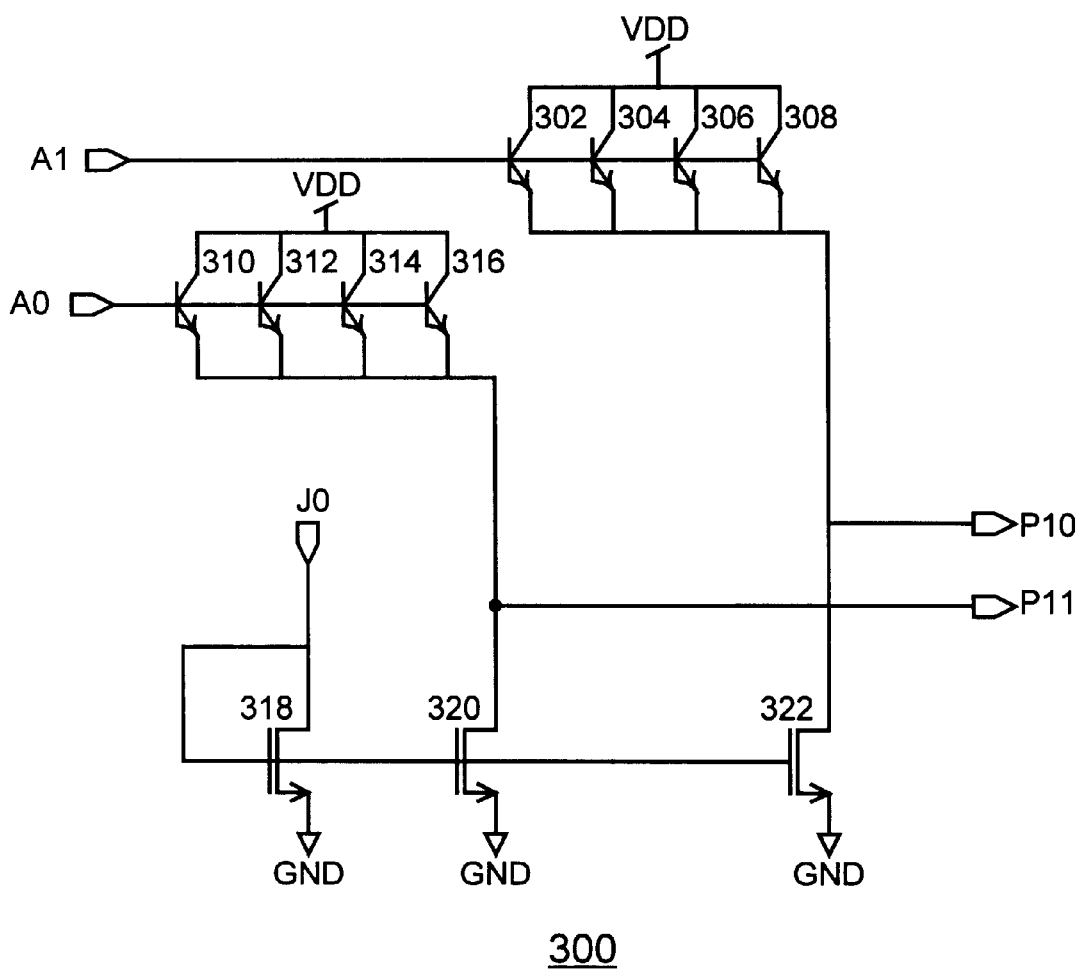
FIG. 3 is a schematic diagram of an emitter follower stage of the preferred embodiment.

Referring to FIG. 3, there is shown an emitter follower stage generally designated by the reference character 300 of the preferred embodiment. Emitter follower stage 300 is used to shift the signal common mode. An input signal A1 is applied to the base of a plurality of NPN transistors 302, 304, 306 and 308. An input signal A0 is applied to the base of a plurality of NPN transistors 310, 312, 314 and 316. The collector of each of the NPN transistors 302, 304, 306, 308, 310, 312, 314 and 316 is connected to the supply voltage VDD. The emitter of each of the NPN transistors 302, 304, 306, 308 is connected to an output P10. The emitter of each of the NPN transistors 310, 312, 314 and 316 is connected to an output P11. An N-channel field effect transistor NFET 318 is connected between a reference current input J0 and ground. The gate of NFET 318 is connected to the adjustable current input J0 and to the gate of an NFET 320 and the gate of an NFET 322. NFET 320 is connected between the emitters of the NPN transistors 310, 312, 314 and 316 at output P11 and ground. NFET 322 is connected between the emitters of the NPN transistors 302, 304, 306, 308 at output P10 and ground. The output at P10, P10 is the signal that is applied to the driver 100 of FIG. 1.

Figure 4:
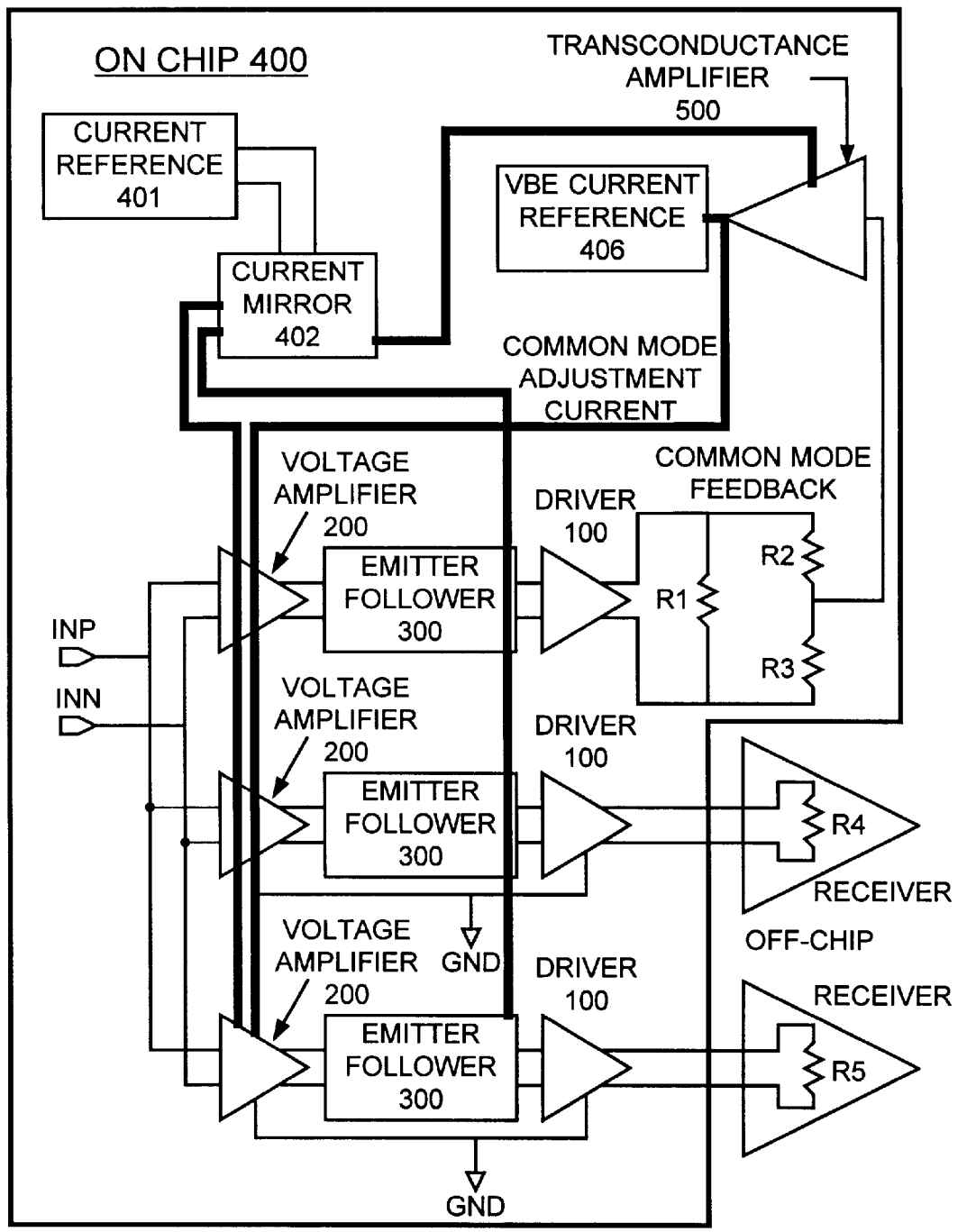
FIG. 4 is a schematic and block diagram of a high speed differential output driver with increased voltage swing and predrive common mode adjustment of the preferred embodiment.

Referring to FIG. 4, there is shown a high speed differential output driver with increased voltage swing and pre-drive common mode adjustment generally designated by the reference character 400 of the preferred embodiment. An external driver path with an input signal INP, INN coming into parallel voltage amplifiers 200, level shifting through the respective emitter follower 300, and through the respective driver 100, then off-chip to a pair of receivers respectively labeled R4, R5 for a processor or other module.

The common mode level of the output is set through a replicated driver path with a feedback loop on-chip 400. A duplicate path of the voltage amplifier 200, emitter follower 300 and driver 100 is sent a copy of the signal that each external driver path receives. This driver is loaded with an on-chip differential termination R1 designed to match the external loading of the other drivers. In parallel with this load R1 are a pair of high value resistors R2, R3, for example, 10Kohm resistors, in series used to find the average of the high side and the low side of the signal swing. The node between the resistors R2, R3, the common mode feedback, feeds into the negative side of a transconductance amplifier 500 illustrated in detail in FIG. 5. A current reference 401 provides inputs to a current mirror 402. Current mirror 402 provides current inputs J0 to the voltage amplifiers 200, the emitter followers 300 and the transconductance amplifier 500. A VBE current reference 406 is connected to the transconductance amplifier 500 which provides a common mode adjustment current J1 applied to the voltage amplifiers 200.

Figure 5A:
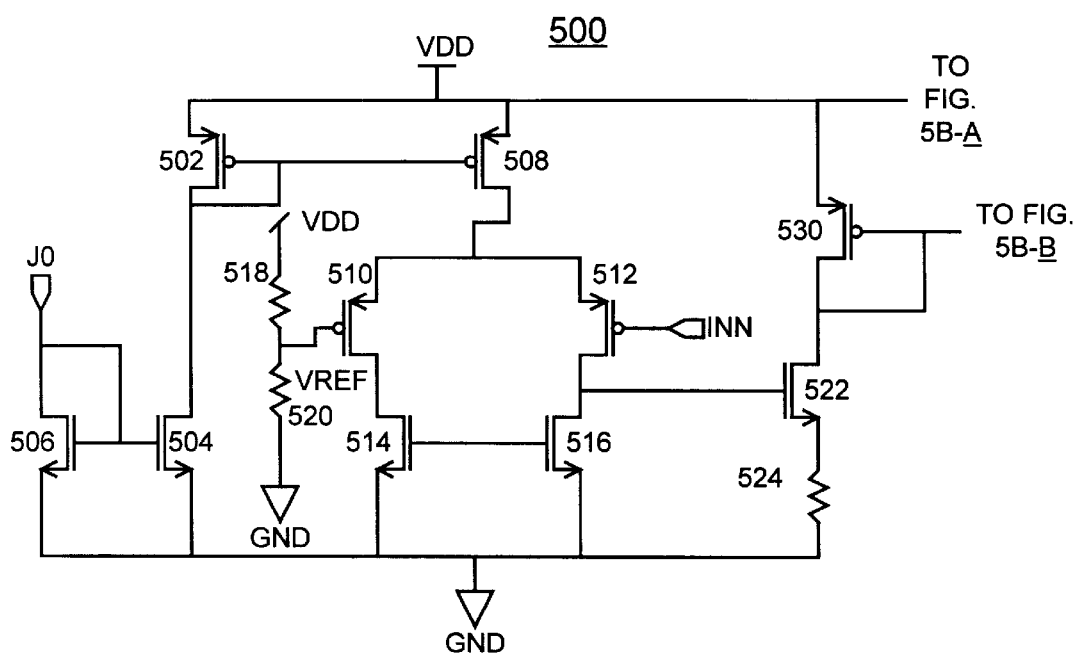
FIGS. 5A and 5B together provide a schematic diagram of a transconductance amplifier stage of the preferred embodiment.
Figure 5B:
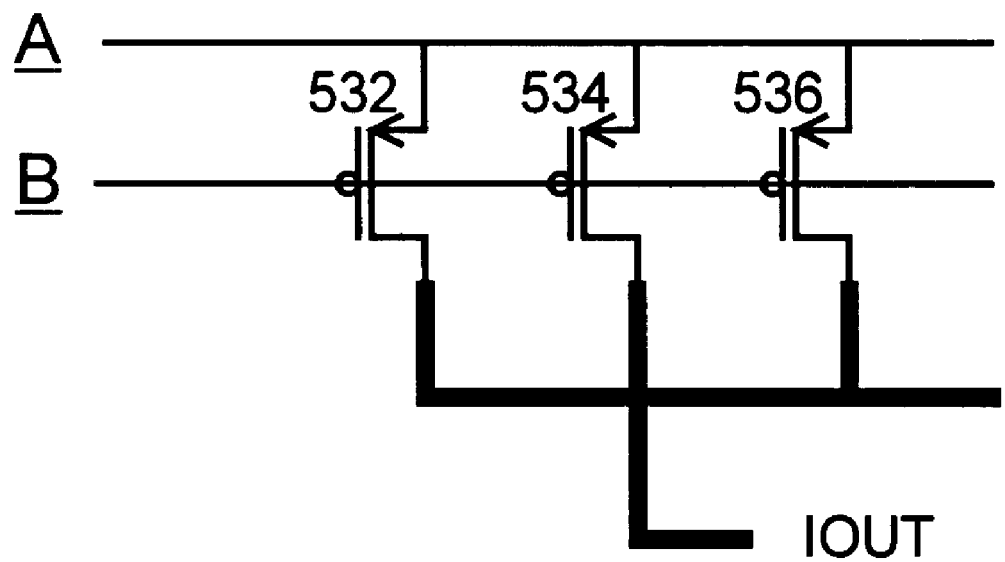

Referring to FIGS. 5A and 5B, there is shown a transconductance amplifier generally designated by the reference character 500 of the preferred embodiment. The transconductance amplifier 500 provides a common mode adjustment current IOUT in FIG. 5B. The transconductance amplifier 500 includes a P-channel field effect transistor PFET 502 connected in series with an N-channel field effect transistor NFET 504. A reference current J0 is applied to a drain and a gate of an NFET 506 and applied to a gate of NFET 504. A PFET 508 is connected between the supply voltage VDD and a drain of each of a differential pair of PFETs 510 and 512. A pair of NFETs 514 and 516 are respectively connected between the source of PFETs 510 and 512 and ground. A pair of voltage divider resistors 518 and 520 provide a voltage reference VREF to the gate of PFET 510. An average voltage input INN from the junction of R2, R3 of FIG. 4 is applied to the gate of PFET 512. A gate of an NFET 522 is connected to the source and drain connection of PFET 512 and NFET 516. The source of NFET 522 is connected to a resistor 524 that is connected to ground. The drain of NFET 522 is connected to the source and gate of a PFET 530. The drain of PFET 530 is connected to the voltage supply VDD. Referring also to FIG. 5B, a plurality of current mirror PFETs 532, 534, and 536 are connected in parallel with the reference current PFET 530.

In operation, the transconductance amplifier 500 receives the value from the node between the resistors R2, R3 in FIG. 4 at input INN and compares this input voltage to the VREF at the positive side of the amplifier and a current proportional to the difference between the two is produced at IOUT in FIG. 5B. This current is added to a current from a VBE generated current reference 406 which provides a temperature compensated current and goes to the adjustable J1 input of the voltage amplifier 200 of FIG. 2. As this current changes, the amplitude and thus the common mode of the signal out of the voltage amplifier 200 is changed. The loop settles out when the voltage at the negative input of the transconductance amplifier 500 which should also be equal to the average common mode of the output driver signal is balanced with the voltage at the positive input VREF. This loop provides stable and accurate control of the output common mode over process, temperature, voltage, and frequency variation.

All of the amplifier books and driver books receive their reference currents from a current mirror off of the same current reference 401 as shown in FIG. 4. With only currents being shipped across chip to each of the driver path books, wire resistances causing voltage drops are less of an issue. This improves signal matching, and reduces driver to driver skews. It also helps to insure that the signal in the feedback loop is averaging to set the common mode is similar in characteristics to the output driver signals.

While the present invention has been described with reference to the details of the embodiments of the invention shown in the drawing, these details are not intended to limit the scope of the invention as claimed in the appended claims.

What is claimed is:

1. A high speed differential output driver comprising:

a differential input signal;

a voltage amplifier receiving said differential input signal and a common mode adjustment signal and providing an adjustable voltage amplified signal;

an emitter follower coupled to said voltage amplifier, said emitter follower providing a level shifted voltage amplified signal;

a driver coupled to said emitter follower receiving said level shifted voltage amplified signal and providing a driver output signal; and wherein a duplicate copy of said voltage amplifier, said emitter follower and said driver receives said differential input and is connected with a predetermined load and a pair of series connected resistors connected in parallel with said predetermined load.

2. A high speed differential output driver as recited in claim 1 wherein a node between said pair of series connected resistors provides a voltage input; said voltage input applied to a transconductance amplifier; said transconductance amplifier receiving a reference voltage and providing an output current proportional to a difference between said voltage input and said reference voltage.

3. A high speed differential output driver as recited in claim 2 wherein said output current of said transconductance amplifier is added to a reference current and applied to said voltage amplifier as said common mode adjustment signal.

4. A high speed differential output driver comprising:

a differential input signal;

a voltage amplifier receiving said differential input signal and a common mode adjustment signal and providing an adjustable voltage amplified signal;

an emitter follower coupled to said voltage amplifier, said emitter follower providing a level shifted voltage amplified signal; and a driver coupled to said emitter follower receiving said level shifted voltage amplified signal and providing a driver output signal; wherein said driver includes a first series connected P-channel field effect transistor (PFET) and N-channel field effect transistor (NFET) receiving a differential signal gate input A1 and a second series connected P-channel field effect transistor (PFET) and N-channel field effect transistor (NFET) receiving a differential signal gate input A0.

5. A high speed differential output driver as recited in claim 4 wherein a drain of said PFETs are connected via a resistor to a supply voltage.

6. A high speed differential output driver as recited in claim 5 wherein a source of said NFETs are connected via a resistor to ground potential.

7. A high speed differential output driver as recited in claim 4 wherein said voltage amplifier includes a pair of bipolar transistors receiving a differential signal input, said differential signal input applied to a base of said pair of bipolar transistors and a collector of said pair of bipolar transistors connected to a supply voltage.

8. A high speed differential output driver as recited in claim 7 wherein an emitter of said pair of bipolar transistors is respectively connected to a base of a second differential amplifier bipolar transistor pair; a respective collector of said second differential amplifier bipolar transistor pair providing said adjustable voltage amplified signal.

9. A high speed differential output driver as recited in claim 8 wherein said common mode adjustment signal is applied to a pair of N-channel field effect transistors coupled to said second differential amplifier bipolar transistor pair for adjusting said adjustable voltage amplified signal.

10. A high speed differential output driver as recited in claim 8 wherein said emitter follower include a plurality of bipolar transistors connected in parallel and receiving differential signal base input signals and providing said level shifted voltage amplified signal at an emitter of said plurality of bipolar transistors.

11. A high speed differential output driver comprising:

an differential input;

a voltage amplifier receiving said differential input signal and a common mode adjustment signal and providing an adjustable voltage amplified signal;

an emitter follower coupled to said voltage amplifier, said emitter follower providing a level shifted voltage amplified signal;

a driver coupled to said emitter follower receiving said level shifted voltage amplified signal and providing a driver output signal;

a duplicate copy of said voltage amplifier, said emitter follower and said driver receiving said differential input and connected with a predetermined load and a pair of series connected resistors connected in parallel with said predetermined load providing a voltage signal between said series connected resistors; and a transconductance amplifier receiving said voltage signal and a reference voltage and providing an output current proportional to a difference between said voltage input and said reference voltage.

12. A high speed differential output driver as recited in claim 11 wherein said output current of said transconductance amplifier is added to a reference current to provide said common mode adjustment signal applied to said voltage amplifier.

* * * * *